United States Patent
Bittner et al.

(10) Patent No.: US 7,765,509 B2
(45) Date of Patent: *Jul. 27, 2010

(54) AUTO CONNECTION ASSIGNMENT SYSTEM AND METHOD

(75) Inventors: Adam Matthew Bittner, South Burlington, VT (US); Timothy W. Budell, Milton, VT (US); Robert C. Cusimano, South Hero, VT (US); Richard Dauphin, Shelburne, VT (US); Matthew Thomas Guzowski, Essex, VT (US); Craig Paul Lussier, Williston, VT (US); David Brian Stone, Jericho, VT (US); Patrick G. Wilder, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 350 days.

This patent is subject to a terminal disclaimer.

(21) Appl. No.: 11/858,995

(22) Filed: Sep. 21, 2007

(65) Prior Publication Data
US 2008/0010625 A1 Jan. 10, 2008

Related U.S. Application Data

(63) Continuation of application No. 11/159,915, filed on Jun. 23, 2005, now Pat. No. 7,275,229.

(51) Int. Cl.
*G06F 17/50* (2006.01)
(52) U.S. Cl. .............................. 716/12; 716/14; 716/15
(58) Field of Classification Search .................. 716/12, 716/14, 15
See application file for complete search history.

(56) References Cited

U.S. PATENT DOCUMENTS

| 5,677,847 | A  | 10/1997 | Walling |
| 6,144,091 | A  | 11/2000 | Washida |
| 6,426,550 | B2 | 7/2002  | Ball et al. |
| 6,499,134 | B1 | 12/2002 | Buffet et al. |
| 6,510,539 | B1 | 1/2003  | Deemie et al. |
| 6,519,749 | B1 | 2/2003  | Chao et al. |
| 6,521,846 | B1 | 2/2003  | Freda et al. |
| 6,584,606 | B1 | 6/2003  | Chiu et al. |
| 6,594,811 | B2 | 7/2003  | Katz |
| 6,662,348 | B1 | 12/2003 | Naylor et al. |
| 2004/0078767 | A1 | 4/2004 | Burks et al. |

*Primary Examiner*—Sun J Lin
(74) *Attorney, Agent, or Firm*—Schmeiser, Olsen & Watts; Wenjie Li (57) ABSTRACT

A system and method for generating simulated wiring connections between a semiconductor device and a carrier. The method comprises identifying a plurality of first factors and instances of each first factor relating to the semiconductor device and identifying a plurality of second factors and instances of each second factor relating to the carrier. The first and second factors are associated with each other on a one-to-one basis. A simulated wiring connection is generated between a first I/O terminal and a matching second I/O terminal, subject to an identified instance of each first factor of each first I/O terminal being correlated to an identified instance of the associated second factor of the matching second I/O terminal. A simulated wiring connection is generated between third I/O terminals located in a first region and fourth I/O terminals located in a second region.

20 Claims, 9 Drawing Sheets

AUTO CONNECTION ASSIGNMENT SYSTEM AND METHOD

This application is a Continuation of Ser. No. 11/159,915, filed Jun. 23, 2005, now U.S. Pat. No. 7,275,229, issued Sep. 25, 2007.

BACKGROUND OF THE INVENTION

1. Technical Field

The present invention relates to an auto connection assignment system and method.

2. Related Art

Designing an interconnection system between electrical structures typically requires a difficult, tedious, and costly procedure that is very time consuming. Therefore there exists a need for simple, low cost, time efficient procedure to design an interconnection system between electrical structures.

SUMMARY OF THE INVENTION

The present invention provides a method for generating simulated wiring connections between first I/O terminals of a semiconductor device and second I/O terminals of a carrier, said method adapted to be performed by execution of a connection assignment algorithm on a processor of a computer system, said method comprising:

identifying a plurality of first factors and instances of each first factor, said first factors relating to the semiconductor device;

identifying a plurality of second factors and instances of each second factor, said second factors relating to the carrier, said first and second factors being associated with each other on a one-to-one basis, the instances of each first factor being correlated to the instances of each associated second factor on a one-to-one basis, said first I/O terminals comprising an identified instance of each first factor, said second I/O terminals comprising an identified instance of each second factor; and automatically generating a simulated wiring connection between each first I/O terminal and a matching second I/O terminal, subject to the identified instance of each first factor of each first I/O terminal being correlated to the identified instance of the associated second factor of the matching second I/O terminal.

The present invention provides a computing system comprising a processor coupled to a computer-readable memory unit, said computer readable memory unit comprising an automatic assignment algorithm that when executed by the processor implements a method for generating simulated wiring connections between first I/O terminals of a semiconductor device and second I/O terminals of a carrier, said method comprising:

identifying a plurality of first factors and instances of each first factor, said first factors relating to the semiconductor device;

identifying a plurality of second factors and instances of each second factor, said second factors relating to the carrier, said first and second factors being associated with each other on a one-to-one basis, the instances of each first factor being correlated to the instances of each associated second factor on a one-to-one basis, said first I/O terminals comprising an identified instance of each first factor, said second I/O terminals comprising an identified instance of each second factor; and automatically generating a simulated wiring connection between each first I/O terminal and a matching second I/O terminal, subject to the identified instance of each first factor of each first I/O terminal being correlated to the identified instance of the associated second factor of the matching second I/O terminal.

The present invention provides a computer program product, comprising a computer usable medium having a computer readable program code embodied therein, said computer readable program code comprising an automatic assignment algorithm adapted to implement a method for generating simulated wiring connections between first I/O terminals of a semiconductor device and second I/O terminals of a carrier, said method comprising:

receiving into said computer readable medium, data comprising a first plurality of factors related to a semiconductor device;

receiving into said computer readable medium, data comprising a second plurality of factors related to a package;

executing by a processor in said computing system, said automatic assignment algorithm;

comparing by said automatic assignment algorithm, said first plurality of factors to said second plurality of factors; and automatically assigning by said automatic assignment algorithm based on said comparing, simulated wiring connections between a first plurality of input/output (I/O) terminals on said semiconductor device and a second plurality of I/O terminals on said package.

The present invention provides a process for deploying computing infrastructure, comprising integrating computer-readable code into a computer system, said computer-readable code comprising an automatic assignment algorithm, wherein the code in combination with the computer system is capable of performing a method for generating simulated wiring connections between first I/O terminals of a semiconductor device and second I/O terminals of a carrier, said method comprising:

receiving into said computer readable medium, data comprising a first plurality of factors related to a semiconductor device;

receiving into said computer readable medium, data comprising a second plurality of factors related to a package;

executing by a processor in said computing system, said automatic assignment algorithm;

comparing by said automatic assignment algorithm, said first plurality of factors to said second plurality of factors; and automatically assigning by said automatic assignment algorithm based on said comparing, simulated wiring connections between a first plurality of input/output (I/O) terminals on said semiconductor device and a second plurality of I/O terminals on said package.

The present invention advantageously provides a system and associated method for a simple, low cost, time efficient procedure to design an interconnection system between electrical structures.

DETAILED DESCRIPTION OF THE INVENTION

Figure 1:
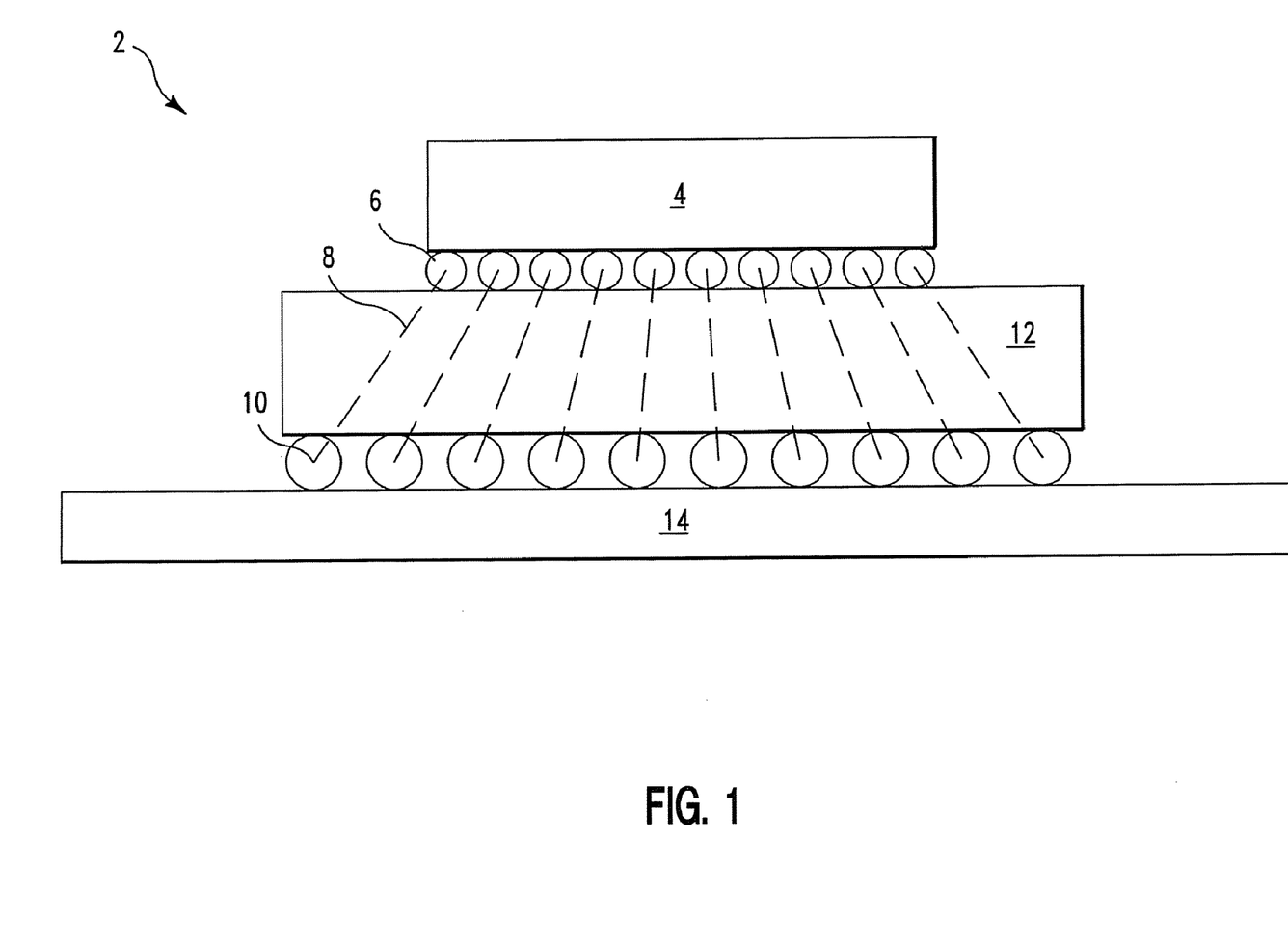
FIG. 1 illustrates a cross-sectional view of a first electrical structure having a semiconductor device electrically connected to a substrate through a package, in accordance with embodiments of the present invention.
Figure 2:
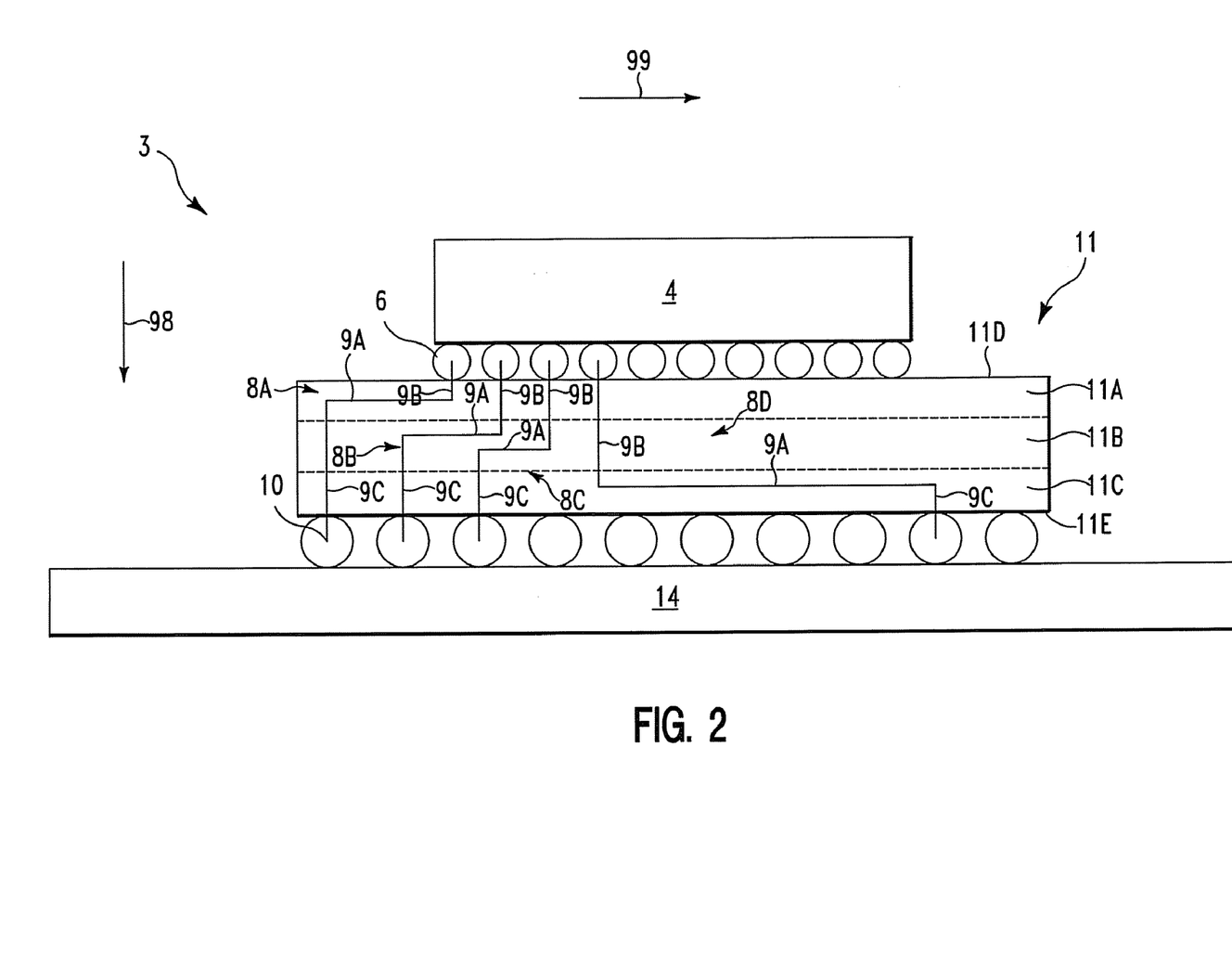
FIG. 2 illustrates a cross-sectional view of a second electrical structure having a semiconductor device electrically connected to a substrate through a package, in accordance with embodiments of the present invention.

FIG. 1 illustrates a cross-sectional view of an electrical structure 2 having a semiconductor device 4 electrically connected to a substrate 14 through a package 12, in accordance with embodiments of the present invention. The electrical structure 2 illustrates a conceptual view of point to point connections (i.e., electrically conductive connections 8) between the semiconductor device 4 and the substrate 14. The semiconductor device 4 may comprise any type of semiconductor device known to a person of ordinary skill in the art including, inter alia, a semiconductor chip, etc. The substrate 14 may comprise any type of substrate known to a person of ordinary skill in the art including, inter alia, a printed circuit board (PCB), etc. The package 12 may comprise any type of package known to a person of ordinary skill in the art including, inter alia, a chip carrier, etc. A plurality of interconnections 6 electrically and mechanically connect the semiconductor device 4 to the package 12. The plurality of interconnections 6 may comprise any type of interconnections including, inter alia, controlled collapse chip connection (C4) solder balls, pads, etc. A plurality of interconnections 10 electrically and mechanically connect the package 12 to the substrate 14. The plurality of interconnections 10 may comprise any type of interconnections including, inter alia, ball grid array (BGA) solder balls, ceramic column grid array (CCGA) interconnections, etc. A plurality of electrically conductive connections 8 individually electrically connect the plurality of interconnections 6 to the plurality of interconnections 10 through the package 12. Therefore, a combination of the electrically conductive connections 8, the package 12, the interconnections 6, and the interconnections 10 electrically connect (i.e., interface) the semiconductor device 4 to the substrate 14. The electrically conductive connections 8 illustrated in FIG. 1 are shown as point to point connection assignments (i.e., electrical connections from the interconnections 6 to the interconnections 10). Routing for the electrically conductive connections 8 is not illustrated in FIG. 1. For example, the package may comprise a plurality of layers and each or some of the conductive connections 8 may be routed on different layers and connected to the interconnections 10 via through hole connections (e.g., as shown in FIG. 2). Additionally, the conductive connections 8 may not be routed as straight line connections as shown in FIG. 1. When designing a package (e.g., package 2 in FIG. 1), various design teams (e.g., a semiconductor device design team, a package design team, and a substrate design team) must coordinate with each other to create point to point connection assignments (e.g., electrical connections from the interconnections 6 to the interconnections 10) between a semiconductor device and a substrate. This coordination is necessary to specify requirements (e.g., various signal type locations on the semiconductor device and the substrate) and to insure that there are no conflicting requirements between the various design teams (e.g., a semiconductor device design team, a package design team, and a substrate design team). An input/output (I/O) signal structure (i.e., a footprint) for the semiconductor device 4 (i.e., by the semiconductor device design team) is designed first. The I/O signal structure for the semiconductor device 4 comprises a specification of a type of signal that is required for each of the interconnections 6 to operate the semiconductor device 4. In order for the substrate design team to begin a design on an I/O signal layout (i.e., to connect to a footprint of the package 12) for the substrate 14 to be interfaced to the semiconductor device 4 via the package 12 (i.e., the package 12 is an interface between the semiconductor device and the substrate 14), an I/O signal layouts for the interconnections 6 and 10 are necessary so that the substrate design team will be able to design I/O signal locations for the substrate 14. The I/O signal layouts for the interconnections 6 and 10 may not meet the substrate design team's requirements (e.g., conflicts between the I/O signal locations on the semiconductor device 4 and I/O signal locations on the substrate 14). An auto assignment system and process for designing the package 12 comprising the point to point connection assignments (i.e., the electrically conductive wires 8) between the interconnections 6 and interconnections 10 is described with reference to FIGS. 3-10.

FIG. 2 illustrates a cross-sectional view of an electrical structure 3 having a semiconductor device 4 electrically connected to a substrate 14 through a package 11, in accordance with embodiments of the present invention. The electrical structure 3 illustrates a practical view of point to point connections (i.e., electrically conductive connections 8A . . . 8D) between a semiconductor device and a substrate as opposed to the conceptual view of FIG. 1. The semiconductor device 4, the interconnections 6 and 10, and the substrate 14 in FIG. 2 are the same as the semiconductor device 4, the interconnections 6 and 10, and the substrate 14 in FIG. 1. The package 11 may comprise any type of package known to a person of ordinary skill in the art including, inter alia, a chip carrier, etc. In contrast with the package 12 of FIG. 1, the package 11 of FIG. 2 depicts a plurality of layers 11A, 11B, and 11C. Each of electrically conductive connections 8A . . . 8D comprises a first conductive via 9B, a conductive wire 9A, and a second conductive via 9C. Each conductive via 9B is connected between an interconnection 6 and a conductive wire 9A and is oriented in a direction 98 that is about perpendicular to a first side 11D and a second side 11E of the package 11. Each wire 9A is placed on or within one of layers 11A . . . 11C and is oriented in a direction 99 that is about parallel to the first side 11D and the second side 11E of the package 11. Each conductive via 9C is connected between an interconnection 10 and a conductive wire 9A is oriented in a direction 98 that is about perpendicular to the first side 11D and the second side 11E of the package 11.

Figure 3:
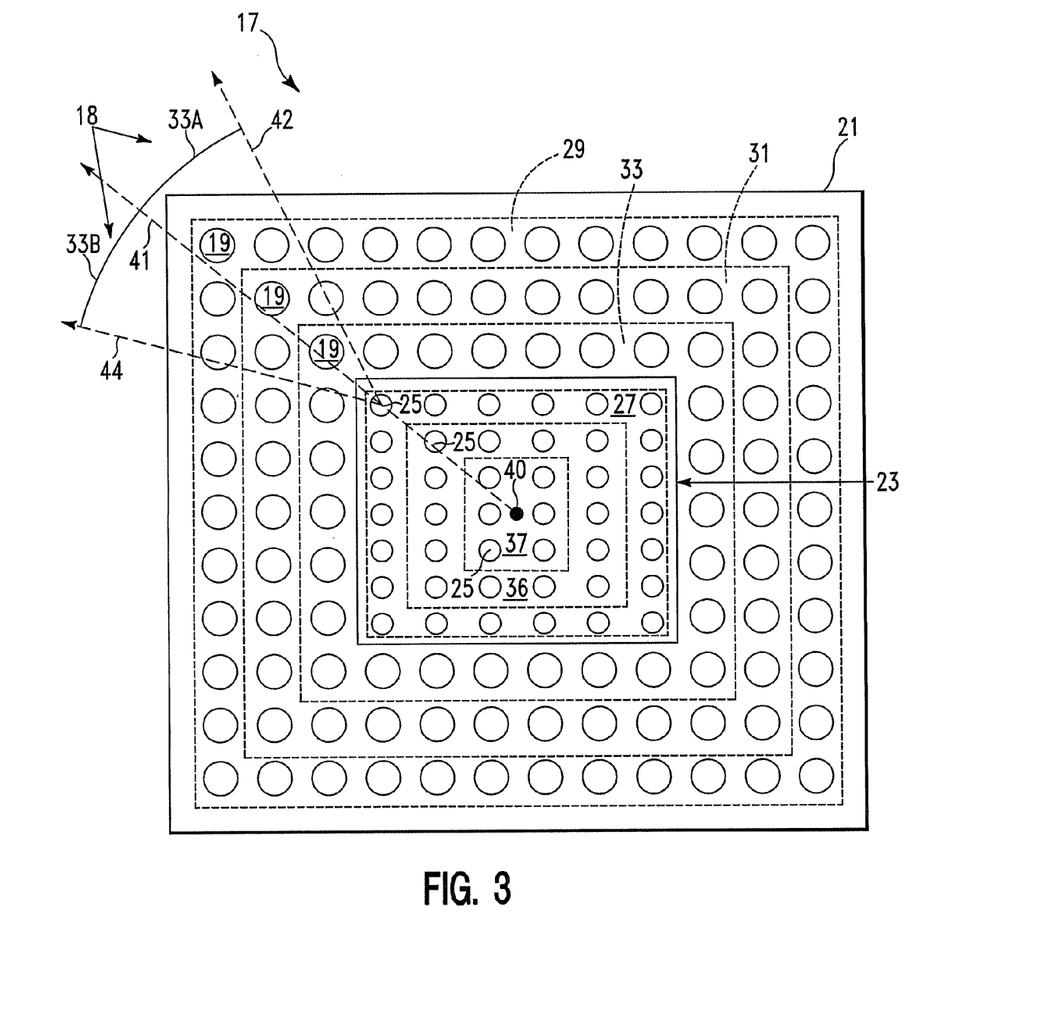
FIG. 3 illustrates a top view of a computer simulated electrical structure having a simulated semiconductor device and a simulated package, in accordance with embodiments of the present invention

FIG. 3 illustrates a top view of a computer simulated electrical structure 17 having a simulated semiconductor device 23 and a simulated package 21, in accordance with embodiments of the present invention. The computer simulated electrical structure 17 in FIG. 3 represents the electrical structure 3 in FIG. 2. The simulated semiconductor device 23 in FIG. 3 represents the semiconductor device 4 in FIG. 2. The simulated package 21 in FIG. 3 represents the package 11 in FIG. 2. The simulated semiconductor device 23 and the simulated package 21 are placed such that the semiconductor device 23 is located parallel to and over the simulated package 21. The semiconductor device 23 and the simulated package 21 each comprise a common center point 40 in a plane of a top side of the simulated package 21 onto which the semiconductor device 23 has been projected. The computer simulated electrical structure 17 is used by a package design team to aid in the design of point to point connection assignments (e.g., electrically conductive connections 8A . . . 8D in FIG. 2 and in particular to conductive wires 9A) in an interface package (e.g., package 11 in FIG. 2) and give a substrate design team (e.g., for substrate 14 in FIG. 2) a general idea of I/O signal locations on the package to aid in a substrate design. The computer simulated electrical structure 17 allows for point to point connection assignments (see connection assignments 35 in FIGS. 5 and 6 as related to conductive wires 9A in FIG. 2) to be modified dependent upon various design team specifications without having to actually build a package. The simulated semiconductor device 23 comprises a footprint having a plurality of simulated interconnections 25 for simulating an electrical and mechanical connection between the semiconductor device 23 and the package 21. The package 21 comprises a footprint having a plurality of simulated interconnections 19 for simulating an electrical and mechanical connection between the package 21 and a substrate (not shown) similar to the substrate 14 of FIG. 2. The simulated interconnections 25 in FIG. 3 represent the interconnections 6 in FIGS. 1 and 2. The simulated interconnections 19 in FIG. 3 represent the interconnections 10 in FIGS. 1 and 2. The simulated interconnections 25 are divided into regions 27, 36, and 37. The simulated interconnections 19 are divided into regions 29, 31, and 33. The present invention presents a method to automatically assign an electrical connection (herein after, "connection") between each of interconnections 25 and interconnections 19 based on design factors (e.g., signals types, etc.). Although not required, a specified region of interconnections 25 may be connected to a specified region of interconnections 19. For example, interconnections 25 in external region 27 may be connected to interconnections 19 in external region 29, interconnections 25 in region 36 may be connected to interconnections 19 in region 31, interconnections 25 in region 33 may be connected to interconnections 19 in region 37, etc. Additionally, each the region 27, 36, and 37 of interconnections 25 may be connected to the region 29, 31, and 33 via a same or different routing layer (e.g., see conductive wires 9A for connections 8A . . . 8D in layers 11A . . . 11C in FIG. 2) of the package 21. A "routing layer" is a layer, such as layer 11A-11C of FIG. 2, that includes conductive wires oriented parallel to the bounding surfaces of the package 11 (i.e., bounding surfaces 11D and 11E). For example, interconnections 25 in external region 27 may be connected to interconnections 19 in external region 29 on a first layer of the package 21 via a conductive wire 9A of FIG. 2, interconnections 25 in region 36 may be connected to interconnections 19 in region 31 on a second layer of the package 21 via a conductive wire 9A of FIG. 2, and interconnections 25 in region 33 may be connected to interconnections 19 in region 37 on a third layer of the package 21 via a conductive wire 9A of FIG. 2. Note that the computer simulated electrical structure 17 may comprise an unlimited number of interconnections 19 and 25. Therefore, each of the semiconductor device 23 and the package 21 may comprise an unlimited number of regions of interconnections 19 and 25.

A computing system (e.g., see computing system 90 in FIG. 9) uses software to generate the simulated electrical structure 17. The computing system (e.g., see computing system 90 in FIG. 9) accepts and manipulates input data related to components within the electrical structure 17 (e.g., semiconductor device 23 and a simulated package 21) and executes a connection assignment algorithm (e.g., see algorithms in FIGS. 7-8) using the input data to generate connection assignments (see connection assignments 35 in FIGS. 5 and 6) to aid in the design of a package and substrate. The input data and manipulations are related to five design factors and instances (e.g., values) of the five design factors.

The first design factor comprises inputting I/O signal types (i.e., instances of I/O signals) for each of the interconnections 19 and 25 and separating the I/O signals for each of the interconnections 19 and 25 by the signal types. The signal types may comprise any signal type including, inter alia, a standard I/O data signal (SIG), a test signal (TST), a phase lock loop signal (PLL), etc. A layout of a location for the signal types on the semiconductor device 23 and on the package 21 may be displayed on an output device of the computing system. These positions may be moved around, but at an added cost to a customer. The computing system may auto assign the connection assignments by signal type.

The second design factor comprises inputting into the computing system a number (i.e., instances) of layers available for routing in the package 21 (i.e., a number of layers in the package 21, e.g., see layers 11A . . . 11C in FIG. 2). Additionally, regions of interconnections on the semiconductor device (e.g., regions 27, 36, and 37 of interconnections 25) may be specified by routing layer. For example, a semiconductor device may have 12 signal regions (e.g., regions 27, 36, and 37 of interconnections 25) and a package may comprise two layers (e.g., see layers 1A . . . 11C in FIG. 2). A first six regions may be routed on a first layer of the package and a second six regions may be routed on a second layer in the package.

The third factor comprises inputting into the computing system an escape pattern for signal I/Os from the semiconductor device 23. The escape pattern specifies details as to where the I/O signals will actually be routed through the package 21. For example, the I/O signals may not routed directly from the interconnection 25 down through the package 21 to an appropriate layer, but may rather escape (i.e., routed to an outside edge of the semiconductor device) and then routed down through the package 21 to the appropriate layer.

The fourth factor comprises assigning region numbers (i.e., instances) so that the computing system may assign connection assignments between interconnection in a specified region on the semiconductor device 23 (e.g., region 27 of interconnections 25) to interconnections a specified region of the package 21 (e.g., region 29 of interconnections 19). For example, an outer region of the semiconductor device 23 (e.g., region 27) may be assigned to an outer region (or as close to the outer region as possible) of the package 21 (e.g., region 29). Each region of interconnections 25 is connected in manner such that assigned connections are routed towards a closest portion (i.e., from the specified interconnection 25) of the perimeter of the semiconductor device 23. As the interconnections 25 are situated closer to the center point 40 of the semiconductor device 23, then the assigned connection to an interconnection 19 will also move closer towards a center of the package 21.

Figure 5:
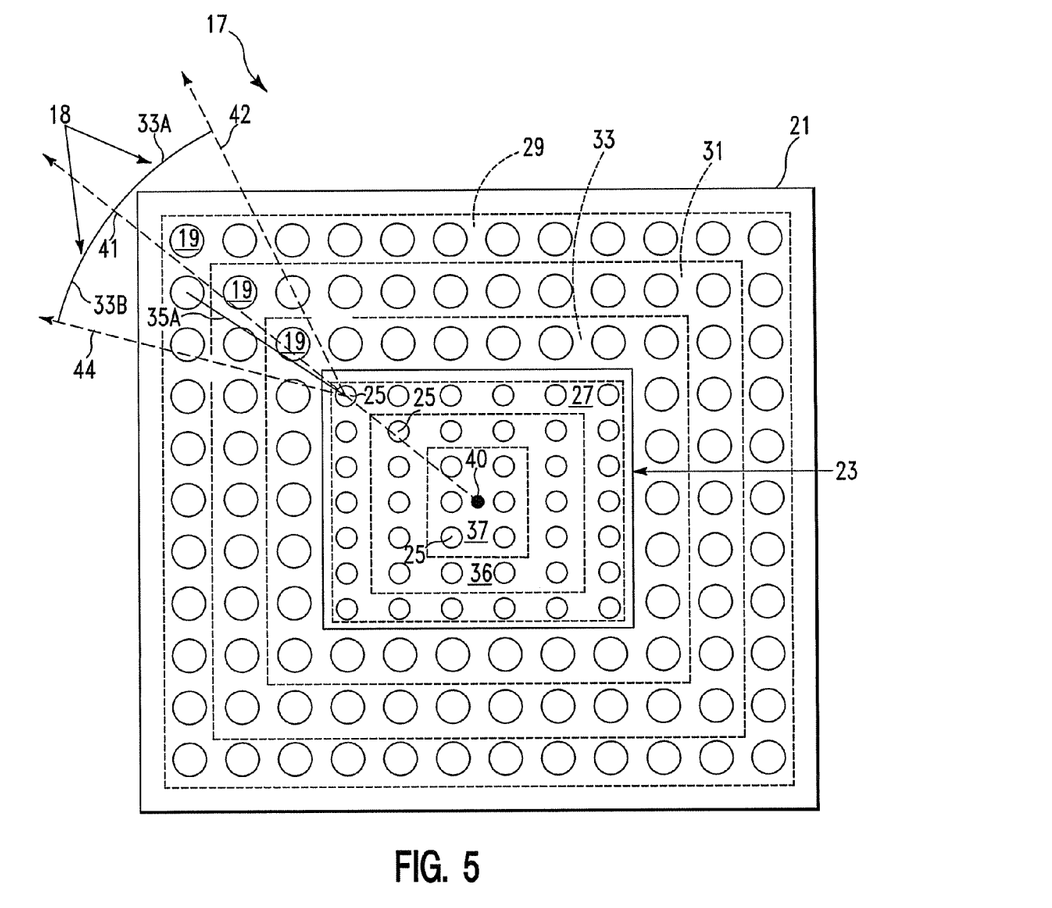
FIG. 5 illustrates a top view of the computer simulated electrical structure of FIG. 3 comprising assigned connections, in accordance with embodiments of the present invention.
Figure 6:
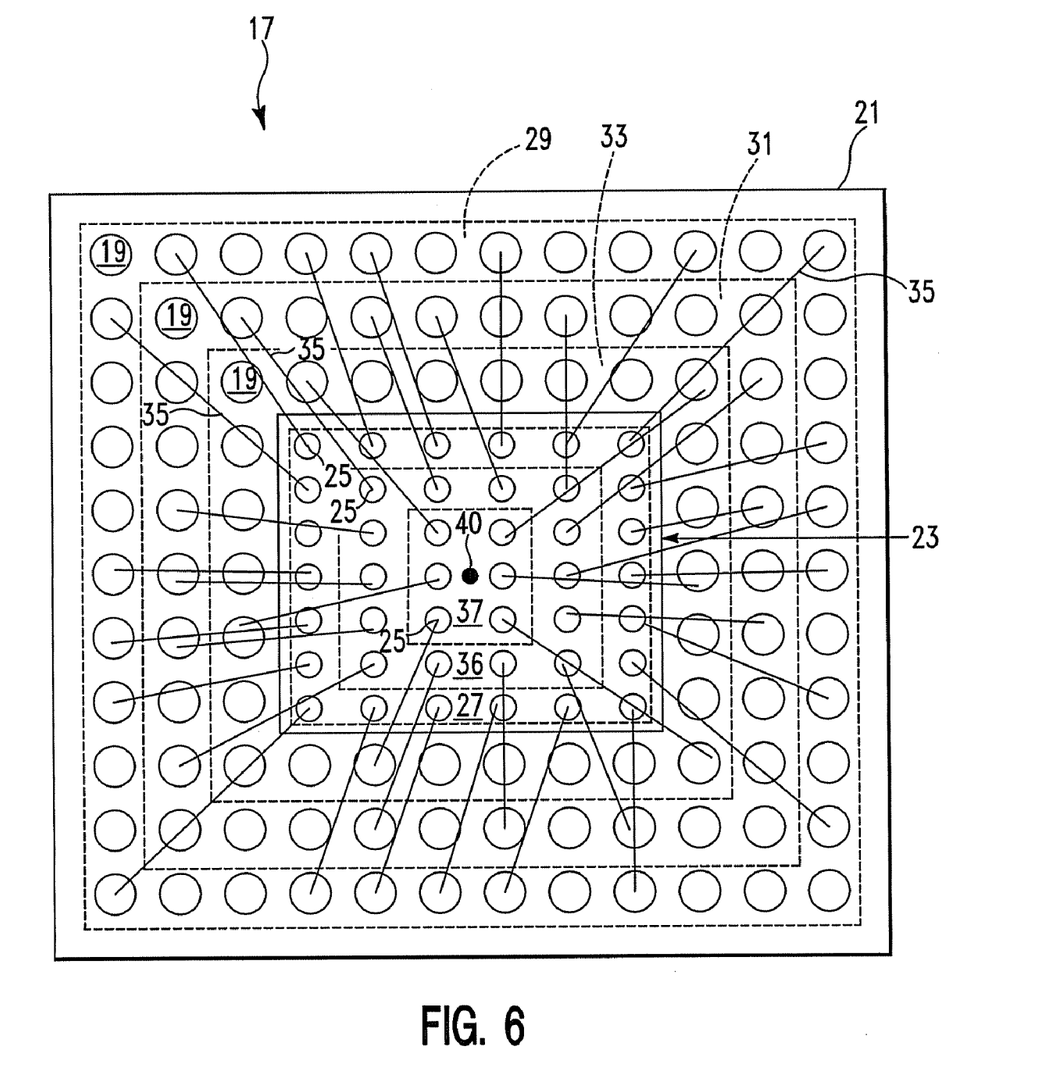
FIG. 6 illustrates a top view of the computer simulated electrical structure of FIG. 3 comprising all assigned connections, in accordance with embodiments of the present invention.

The fifth factor comprises iteratively maintaining a record of assigned connections (assigned connection 35A in FIG. 5 and assigned connections 35 in FIG. 6) including at least one routing layer (e.g., conductive wire 9A of FIG. 2) so that the assigned connections comprise a minimum number of crossovers (i.e., each of the assigned connections 35 of FIG. 6 do not cross over each other). A resulting pattern of assigned connections may look like a starburst pattern as shown in FIG. 6.

Figure 4:
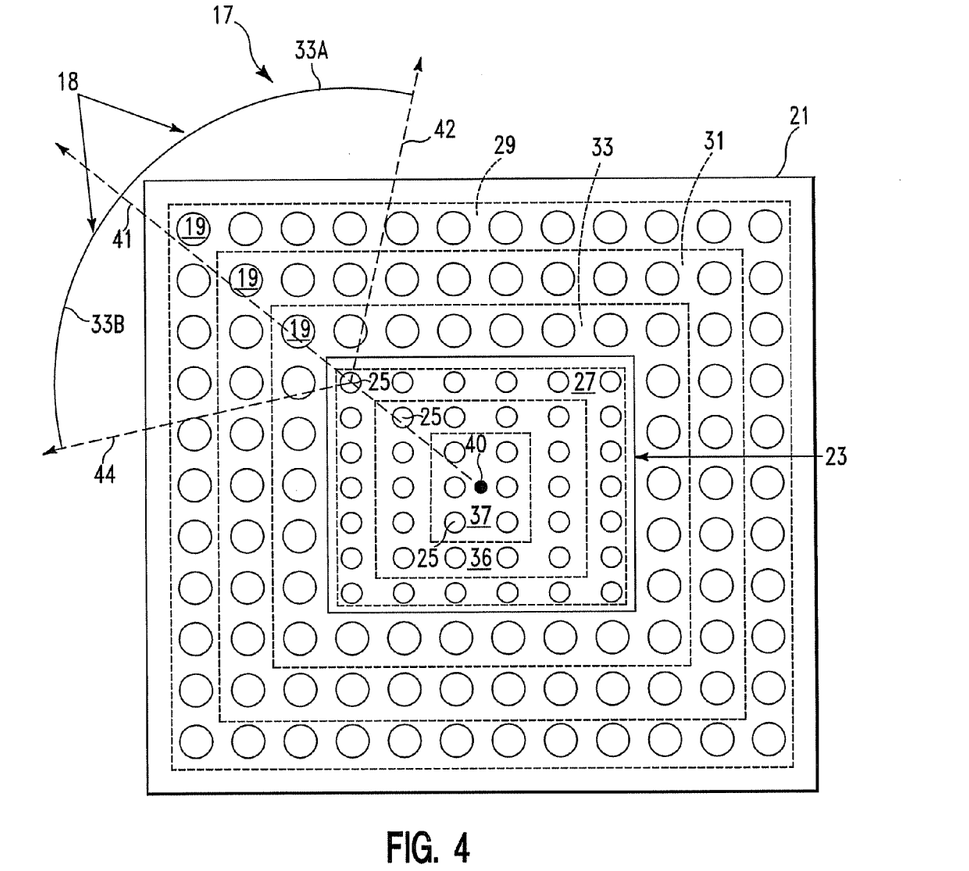
FIG. 4 illustrates a top view of the computer simulated electrical structure of FIG. 3 comprising an increased sector size, in accordance with embodiments of the present invention.

In order to generate connection assignments using the input data (e.g., I/O signal types for each of the interconnections 25 and 19) and manipulating the input data to connect the interconnections 25 to the interconnections 19, a signal type and region (i.e., region 27) for one interconnection 25 on the semiconductor device 23 is selected for an assigned connection 35 and an algorithm is executed (see algorithm in FIG. 8) to form a sector 18 initiating from the selected interconnection 25. The sector 18 comprises rays 42, 44, and bisector ray 41 extending outward from the selected interconnection 25 through a perimeter of the semiconductor device 23 and a perimeter of the package 21. The bisector ray 41 initiates from the center point 40 and extends through the selected interconnection 25. The bisector ray 41 dictates a general direction for an assigned connection 35. The sector 18 comprises a specified minimum angle 33A and 33B between the bisector ray 41 and either of rays 42 or 44. The sector 18 comprises a plurality of interconnections 19 that are candidates for an assigned connection to the selected interconnection 25. The algorithm filters out any of interconnections 19 within the sector 18 that have already been assigned to another interconnection 25. An assignment preference is given to interconnections 19 within region 29 (e.g., external region 27 to external region 29). Additionally, the algorithm filters out any of interconnections 19 within the sector 18 that do not comprise a same I/O signal type as the selected interconnection 25. If there are no interconnections 19 available in the sector 18, the sector 18 may be increased in size by increasing a size of the specified minimum angle 33A and 33B as shown in FIG. 4. If more than one interconnection 19 survives the filtering out and is available, the selection of the interconnection 19 may be by any method (e.g., random sampling). The increased sector 18 size allows for more interconnections 19 that are candidates for an assigned connection to the selected interconnection 25. The above mentioned process is repeated iteratively for each interconnection (i.e., a new sector 18 is formed one interconnection 25 at a time) until all of the interconnections 25 are connected to a unique interconnection 19.

FIG. 4 illustrates a top view of the computer simulated electrical structure 17 of FIG. 3 comprising an increased sector 18 size, in accordance with embodiments of the present invention. In contrast with FIG. 3, the sector 18 of FIG. 4 size has been increased as described supra in the description of FIG. 3.

FIG. 5 illustrates a top view of the computer simulated electrical structure 17 of FIG. 3 comprising an assigned connection 35A, in accordance with embodiments of the present invention. In contrast with FIG. 3, the assigned connection 35A from row 27 to row 29 (outer row to outer row) has been generated as described supra in the description of FIG. 3. Note that assigned connection 35A includes at least one routing layer (e.g., wires 9A in FIG. 2).

FIG. 6 illustrates a top view of the computer simulated electrical structure 17 of FIG. 3 comprising all of assigned connections 35, in accordance with embodiments of the present invention. In contrast to FIG. 3, all assigned connections 35 have been generated as described in the description of FIG. 3. Note that the assigned connections 35 are representative of wires 9A in FIG. 2.

Figure 7:
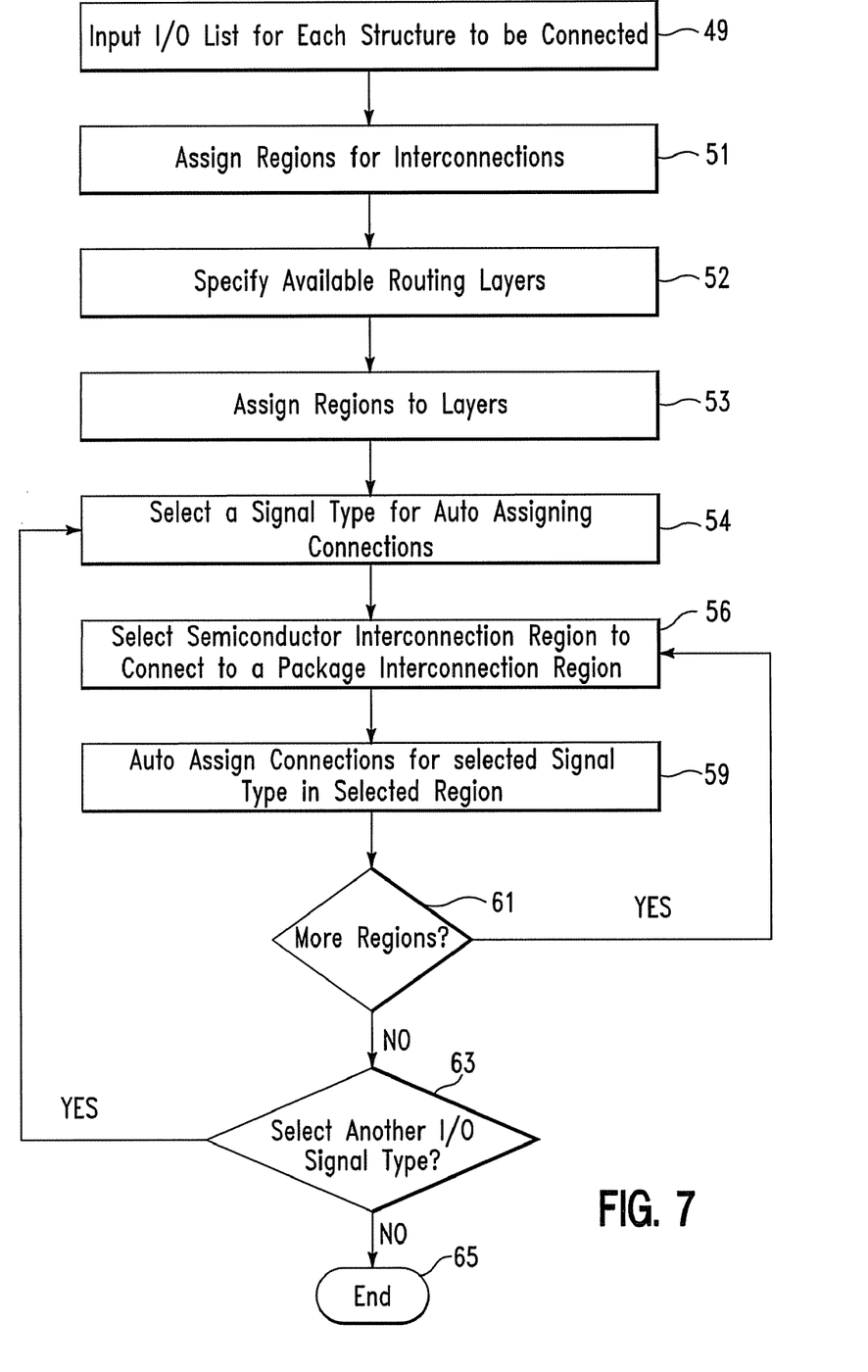
FIG. 7 illustrates a flowchart comprising an algorithm used by the computing system of FIG. 9 to accept and manipulate input data related to the semiconductor device and the simulated package of FIGS. 3-6 and generate the connection assignments with respect to the conductive wires of FIG. 2, in accordance with embodiments of the present invention.
Figure 8:
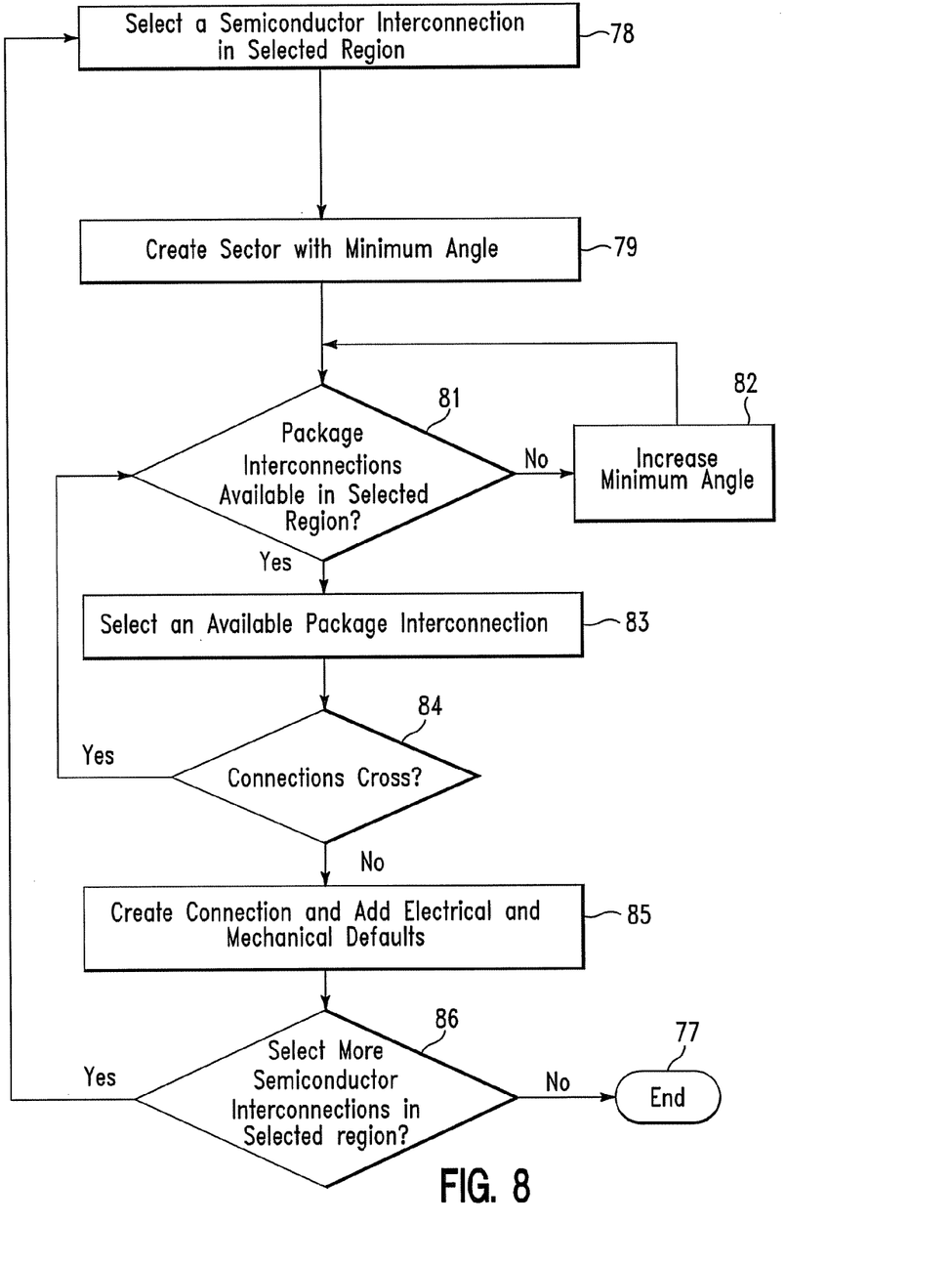
FIG. 8 illustrates a flowchart comprising an algorithm detailing a step in the algorithm of FIG. 7, in accordance with embodiments of the present invention.
Figure 9:
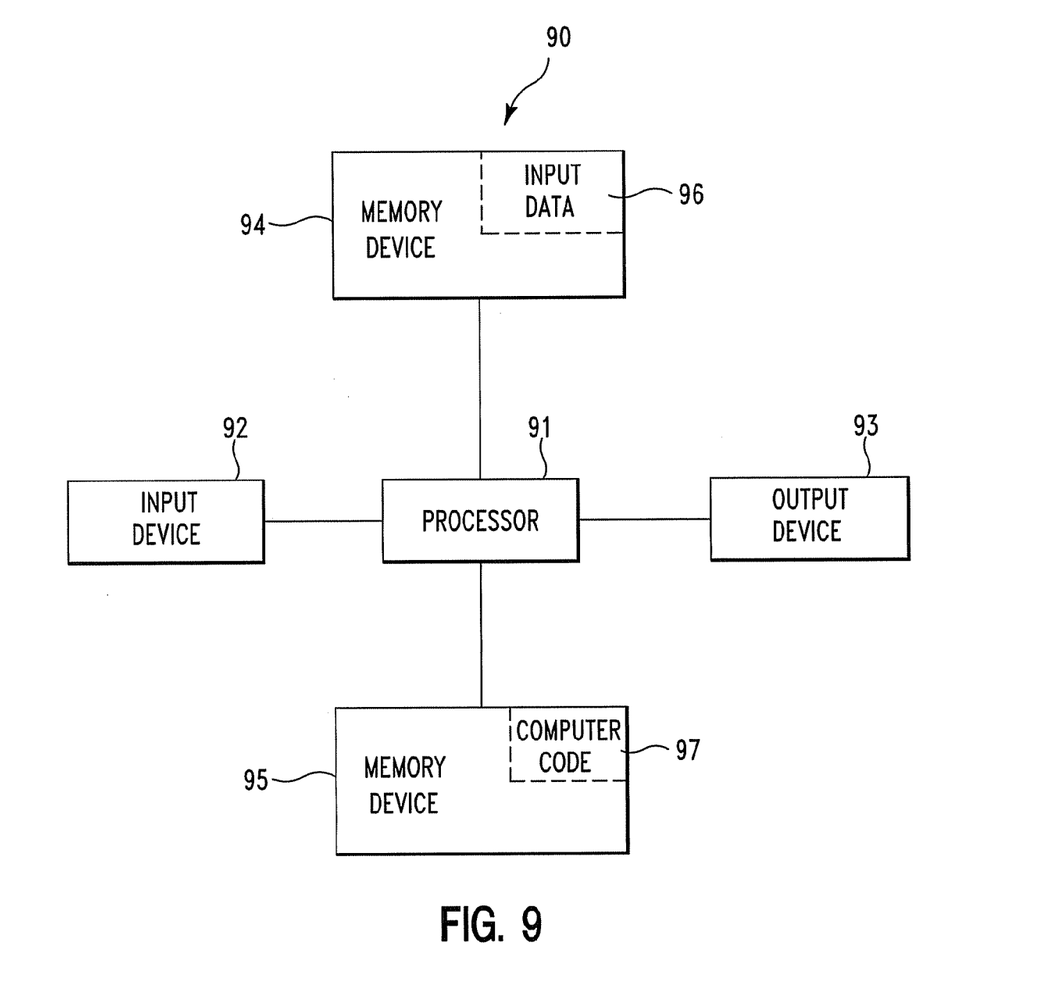
FIG. 9 illustrates a computer system used for implementing the algorithms of FIGS. 7-8 and generating the computer simulated electrical structure and connection assignments of FIGS. 3-6, in accordance with embodiments of the present invention.

FIG. 7 illustrates a flowchart comprising an algorithm used by the computing system 90 of FIG. 9 to accept and manipulate input data related to the semiconductor device 23 and the simulated package 21 of FIGS. 3-6 and generate the connection assignments 35 with respect to routing layers, in accordance with embodiments of the present invention. In step 49, a list of I/O signal types (e.g., SIG, PLL, TST, etc.) for each of the interconnections 25 on the semiconductor device 23 and each of the interconnections 19 on the package 21 is inputted into the computing system 90. In step 51, the interconnections 25 are assigned specified regions and the interconnections 19 are assigned specified regions as described with respect to FIG. 3. In step 52, a number of available routing layers for the package 21 are specified. For example, FIG. comprises 3 routing layers 11A . . . 11C. In step 53, specified regions for the interconnections 25 to be routed are assigned to specified routing layers in the package 21. In step 54, a specific I/O signal type is selected for auto assigning connections 35 between interconnections 25 on the semiconductor device 23 and interconnections 19 on the package 21. In step 56, a region for the interconnections 25 and a region for the interconnections 19 are selected for connection to each other. In step 59, assigned connections 35 for the selected I/O signal type of step 54 are generated until the selected region of interconnections 25 from step 56 are all connected to interconnections 19. Step 59 is described in more detail in the description infra of FIG. 8. Step 61, determines if more regions for the interconnections 25 of the selected signal type from step 54 for connection to the interconnections 19 remain to be connected. If in step 61, more regions of the selected signal type from step 54 remain to be connected then the algorithm loops back to step 56. If in step 61, no more regions of the selected signal type from step 54 remain to be connected, then step 63 is next executed. Step 63 determines if another I/O signal remains to be selected. If in step 63, another I/O signal type for auto assigning connections 35 between interconnections 25 on the semiconductor device 23 and interconnections 19 on the package 21 is to be selected, the algorithm loops back to step 54 to process the next I/O signal. If in step 63, another I/O signal type is not to be selected or there are no more I/O signal types available then the algorithm ends in step 65.

FIG. 8 illustrates a flowchart comprising an algorithm detailing step 59 in the algorithm of FIG. 7, in accordance with embodiments of the present invention. In step 78, a semiconductor device 23 interconnection 25 is selected for an assigned connection to an interconnection 19. The interconnection 25 selected for an assigned connection is selected from a specified region of the semiconductor device 23 (e.g., region 27 in FIGS. 3-6). In step 79, a sector 18 comprising a specified minimum angle is generated initiating from the selected interconnection 25 as described with respect to FIG. 3. In step 81, a determination is made as to whether there are any available package interconnections 19 within the sector 18 that may be candidates (i.e., comprise a same signal type in the specified region from step 56 of FIG. 7) for an assigned connection 35 to the selected interconnection 25 from step 78. If in step 81 there are not any available package interconnections 19 within the sector 18 that may be candidates, then the minimum angle is increased in step 82 thereby increasing a size of the sector 18 and step 81 is repeated. If in step 81 there are available package interconnections 19 within the sector 18 that may be candidates for an assigned connection to the selected interconnection 25 from step 78, then a package interconnection 19 located within the sector 18 is selected for a selected assigned connection 35 to the selected interconnection 25 from step 78. If more than one interconnection 19 can be selected, then the particular interconnection 19 selected may be by any method (e.g., random sampling). In step 84, a determination is made as to whether the selected assigned connection 35 from step 83 crosses any established assigned connections. If in step 84, it is determined that the selected assigned connection 35 from step 83 crosses any other established connections then the algorithm will loop back to step 81 to similarly select another package interconnection 19. If in step 84, it is determined that the selected assigned connection 35 from step 83 does not cross any other assigned connections then an assigned connection 35 is generated according to specified electrical and mechanical parameter defaults in step 85. Electrical and mechanical defaults may comprise any electrical and mechanical defaults including, inter alia, a location of the assigned connection 35 with respect to a reference plane, electrical delay parameters, resistance parameters, capacitance parameters, impedance parameters, noise parameters, etc. In step 86, a determination is made as to whether any more semiconductor device 23 interconnections 25 in the selected region are to be selected for an assigned connection. If in step 86, no more semiconductor device 23 interconnections 25 in the selected region are selected for an assigned connection then the algorithm ends in step 77. If in step 86, more semiconductor device 23 interconnections 25 are to be selected for an assigned connection then the algorithm will loop back to step 78.

FIG. 9 illustrates a computer system 90 used for implementing the algorithms of FIGS. 7-8 and generating the computer simulated electrical structure 17 and connection assignments 35 of FIGS. 3-6, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes the algorithms of FIGS. 6-8 and an algorithm for generating the computer simulated electrical structure 17 and connection assignments 35 of FIGS. 3-6. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 9) may comprise the algorithms of FIGS. 7-8 and the computer simulated electrical structure 17 and connection assignments 35 of FIGS. 3-6 and may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

Thus the present invention discloses a process for deploying or integrating computing infrastructure, comprising integrating computer-readable code into the computer system 90, wherein the code in combination with the computer system 90 is capable of performing a method used for implementing the algorithms of FIGS. 7-8 and generating the computer simulated electrical structure 17 and connection assignments 35 of FIGS. 3-6. While FIG. 9 shows the computer system 90 as a particular configuration of hardware and software, any configuration of hardware and software, as would be known to a person of ordinary skill in the art, may be utilized for the purposes stated supra in conjunction with the particular computer system 90 of FIG. 9. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for generating simulated wiring connections between a semiconductor device and a carrier, said method adapted to be performed by execution of a connection assignment algorithm on a processor of a computer system, said method comprising:

identifying a plurality of first factors and instances of each first factor, said plurality of first factors relating to the semiconductor device, wherein said semiconductor device is located parallel to and over said carrier such that said semiconductor device and said carrier comprise a common center point in a plane of a top side of the carrier onto which the semiconductor device has been projected;

identifying a plurality of second factors and instances of each second factor, said plurality of second factors relating to the carrier, said plurality of first factors and said plurality of second factors being associated with each other on a one-to-one basis, the instances of each first factor being correlated to the instances of each associated second factor on a one-to-one basis, first I/O terminals on said semiconductor device comprising an identified instance of each first factor, second I/O terminals on said carrier comprising an identified instance of each second factor;

forming a simulated sector initiating from an I/O terminal from said first I/O terminals and extending outward in said plane through a perimeter of said semiconductor device and a perimeter of said carrier, wherein said simulated sector comprises a first angle;

automatically generating a simulated wiring connection between each first I/O terminal and a matching second I/O terminal, subject to the identified instance of each first factor of each first I/O terminal being correlated to the identified instance of the associated second factor of the matching second I/O terminal, wherein said automatically generating comprises locating a first said simulated wiring connection from said I/O terminal from said first I/O terminals to said matching second I/O terminal within said simulated sector comprising said first angle;

identifying a first region on said semiconductor device, said first region comprising third I/O terminals on said semiconductor device;

identifying a second region on said carrier, said second region comprising fourth I/O terminals on said carrier; and automatically generating a simulated wiring connection between each I/O terminal of said third I/O terminals located in said first region and an associated I/O terminal of said fourth I/O terminals located in said second region.

2. The method of claim 1, wherein said third I/O terminals located in said first region are formed in a geometric configuration such that said third I/O terminals form a perimeter surrounding said common center point.

3. The method of claim 2, wherein said fourth I/O terminals in said second region are formed in a geometric configuration such that said third I/O terminals form a perimeter surrounding said perimeter of said semiconductor device.

4. The method of claim 1, further comprising:
iteratively maintaining a record of each said simulated wiring connection between each said first I/O terminal and each said matching second I/O terminal.

5. The method of claim 1, further comprising:
iteratively maintaining a record of each said simulated wiring connection between each said I/O terminal of said third I/O terminals and each said associated I/O terminal of said fourth I/O terminals.

6. The method of claim 1, wherein each first factor is selected from the group consisting of signal type, an escape pattern for said carrier, and specified regions for said carrier, and wherein each second factor is selected from the group consisting of said signal type, an escape pattern for said semiconductor device, and specified regions for said semiconductor device.

7. A computing system comprising a processor coupled to a computer-readable memory unit, said memory unit comprising a computer readable code configured to be executed by the processor to perform the method of claim 1.

8. A process for supporting computer infrastructure, said process comprising providing at least one support service for at least one of creating, integrating, hosting, maintaining, and deploying computer-readable code in a computing system, wherein the code in combination with the computing system is capable of performing the method of claim 1.

9. A computer program product, comprising a computer storage medium comprising a computer readable program code embodied therein, said computer readable program code configured to perform the method of claim 1 upon being executed by a processor of a computing system.

10. The method of claim 1, wherein said matching second I/O terminal within said simulated sector comprising said first angle is located using a random sampling process.

11. A method for generating simulated wiring connections between a semiconductor device and a carrier, said method adapted to be performed by execution of a connection assignment algorithm on a processor of a computer system, said method comprising:

identifying a plurality of first factors and instances of each first factor, said plurality of first factors relating to the semiconductor device, wherein said semiconductor device is located parallel to and over said carrier such that said semiconductor device and said carrier comprise a common center point in a plane of a top side of the carrier onto which the semiconductor device has been projected;

identifying a plurality of second factors and instances of each second factor, said plurality of second factors relating to the carrier, said plurality of first factors and said plurality of second factors being associated with each other on a one-to-one basis, the instances of each first factor being correlated to the instances of each associated second factor on a one-to-one basis, first I/O terminals comprising an identified instance of each first factor, second I/O terminals comprising an identified instance of each second factor;

forming a simulated sector initiating from an I/O terminal from said first I/O terminals and extending outward in said plane through a perimeter of said semiconductor device and a perimeter of said carrier, wherein said simulated sector comprises a first angle, wherein said matching I/O terminal from said second I/O terminals is located outside of said sector;

increasing an area of said simulated sector by increasing a size of said first angle to form a second angle that is greater than said first angle; and automatically generating a simulated wiring connection between each first I/O terminal and a matching second I/O terminal, subject to the identified instance of each first factor of each first I/O terminal being correlated to the identified instance of the associated second factor of the matching second I/O terminal, wherein said automatically generating comprises locating a first said simulated wiring connection between said I/O terminal from said first I/O terminals and said matching I/O terminal from said second I/O terminals within said increased area of said simulated sector comprising said second angle;

identifying a first region on said semiconductor device, said first region comprising third I/O terminals on said semiconductor device;

identifying a second region on said carrier, said second region comprising fourth I/O terminals on said carrier; and automatically generating a simulated wiring connection between each I/O terminal of said third I/O terminals located in said first region and an associated I/O terminal of said fourth I/O terminals located in said second region.

12. The method of claim 11, wherein said third I/O terminals located in said first region are formed in a geometric configuration such that said third I/O terminals form a perimeter surrounding said common center point.

13. The method of claim 12, wherein said fourth I/O terminals in said second region are formed in a geometric configuration such that said third I/O terminals form a perimeter surrounding said perimeter of said semiconductor device.

14. The method of claim 11, further comprising:
iteratively maintaining a record of each said simulated wiring connection between each said first I/O terminal and each said matching second I/O terminal.

15. The method of claim 11, further comprising:
iteratively maintaining a record of each said simulated wiring connection between each said I/O terminal of said third I/O terminals and each said associated I/O terminal of said fourth I/O terminals.

16. The method of claim 11, wherein each first factor is selected from the group consisting of signal type, an escape pattern for said carrier, and specified regions for said carrier, and wherein each second factor is selected from the group consisting of said signal type, an escape pattern for said semiconductor device, and specified regions for said semiconductor device.

17. A computing system comprising a processor coupled to a computer-readable memory unit, said memory unit comprising a computer readable code configured to be executed by the processor to perform the method of claim 11.

18. A process for supporting computer infrastructure, said process comprising providing at least one support service for at least one of creating, integrating, hosting, maintaining, and deploying computer-readable code in a computing system, wherein the code in combination with the computing system is capable of performing the method of claim 11.

19. A computer program product, comprising a computer storage medium comprising a computer readable program code embodied therein, said computer readable program code configured to perform the method of claim 11 upon being executed by a processor of a computing system.

20. The method of claim 11, wherein said matching second I/O terminal is located using a random sampling process.

\* \* \* \* \*